(12) United States Patent
Kroeker (10) Patent No.: US 7,445,015 B2
(45) Date of Patent: Nov. 4, 2008

(54) CLUSTER TOOL PROCESS CHAMBER HAVING INTEGRATED HIGH PRESSURE AND VACUUM CHAMBERS

(75) Inventor: Tony R. Kroeker, Georgetown, TX (US)

(73) Assignee: Lam Research Corporation, Freemont, CA (US)

(*) Notice: Subject to any disclaimer, the term of this patent is extended or adjusted under 35 U.S.C. 154(b) by 591 days.

(21) Appl. No.: 10/954,098

(22) Filed: Sep. 30, 2004

(65) Prior Publication Data

US 2006/0065287 A1  Mar. 30, 2006

(51) Int. Cl.
*B08B 3/04* (2006.01)
(52) U.S. Cl. .................. 134/140; 134/200; 134/902
(58) Field of Classification Search ............... 134/21, 134/61, 84, 140, 200, 902
See application file for complete search history.

(56) References Cited

U.S. PATENT DOCUMENTS

| | | | |
|---|---|---|---|
| 3,681,171 A * | 8/1972 | Hojo et al. ............... 156/382 |
| 4,355,937 A * | 10/1982 | Mack et al. .............. 414/217 |
| 4,827,867 A * | 5/1989 | Takei et al. ............... 118/64 |
| 5,169,408 A * | 12/1992 | Biggerstaff et al. ........ 29/25.01 |
| 5,314,574 A * | 5/1994 | Takahashi .................. 438/706 |
| 5,820,692 A * | 10/1998 | Baecker et al. ............. 134/21 |
| 5,898,727 A * | 4/1999 | Fujikawa et al. ........... 373/110 |
| 5,979,306 A * | 11/1999 | Fujikawa et al. ........... 100/90 |
| 6,221,781 B1 * | 4/2001 | Siefering et al. ........... 438/704 |
| 6,321,134 B1 | 11/2001 | Henley et al. |
| 6,334,266 B1 * | 1/2002 | Moritz et al. .............. 34/337 |
| 6,494,670 B2 | 12/2002 | Kroeker |
| 6,497,239 B2 * | 12/2002 | Farmer et al. ............. 134/56 R |
| 6,508,259 B1 * | 1/2003 | Tseronis et al. ............ 134/105 |
| 6,559,070 B1 * | 5/2003 | Mandal ..................... 438/781 |
| 6,666,928 B2 | 12/2003 | Worm |
| 6,722,642 B1 * | 4/2004 | Sutton et al. ............... 269/21 |
| 6,763,840 B2 | 7/2004 | DeSimone et al. |
| 6,921,456 B2 * | 7/2005 | Biberger et al. ......... 156/345.26 |
| 7,077,917 B2 * | 7/2006 | Jones ........................ 134/34 |
| 2001/0041122 A1 * | 11/2001 | Kroeker .................... 414/217 |

OTHER PUBLICATIONS

International Search Report and Written Opinion, PCT/US05/33508, mailed Oct. 2, 2007.
International Preliminary Report on Patentability for PCT/US2005/033508 dated Nov. 9, 2007.

* cited by examiner

*Primary Examiner*—Frankie L Stinson
(74) *Attorney, Agent, or Firm*—Womble Carlyle (57) ABSTRACT

A cluster tool includes a transfer chamber connected to a plurality of vacuum chambers. An additional process chamber connected to the transfer chamber includes a high pressure chamber assembly seated on a housing. The high pressure chamber assembly, which is adjustable between an open position and a closed position, includes an upper chamber portion and a lower chamber portion. Hydraulic cylinders mounted on the upper chamber portion and having chamber rods that attach to the lower chamber portion are configured to move the lower chamber relative to the upper chamber portion between the two positions. When the two portions are brought together into the closed, the high pressure chamber assembly forms a high pressure chamber suitable for processing wafers with supercritical $CO_2$. Once the high pressure chamber is formed, a region between lower chamber portion and a housing may be evacuated to form a vacuum chamber outside a portion of the high pressure chamber.

19 Claims, 8 Drawing Sheets

CLUSTER TOOL PROCESS CHAMBER HAVING INTEGRATED HIGH PRESSURE AND VACUUM CHAMBERS

FIELD OF THE INVENTION

The present invention relates to a process chamber for semiconductor fabrication. More particularly, it pertains to a process chamber including a high pressure chamber assembly that is adjustable between an open position and a closed position. When in the closed position, a high pressure chamber is formed, as is a vacuum chamber. The process chamber may be connected to a cluster tool to which other vacuum chambers are connected.

BACKGROUND OF THE INVENTION

Figure 1:
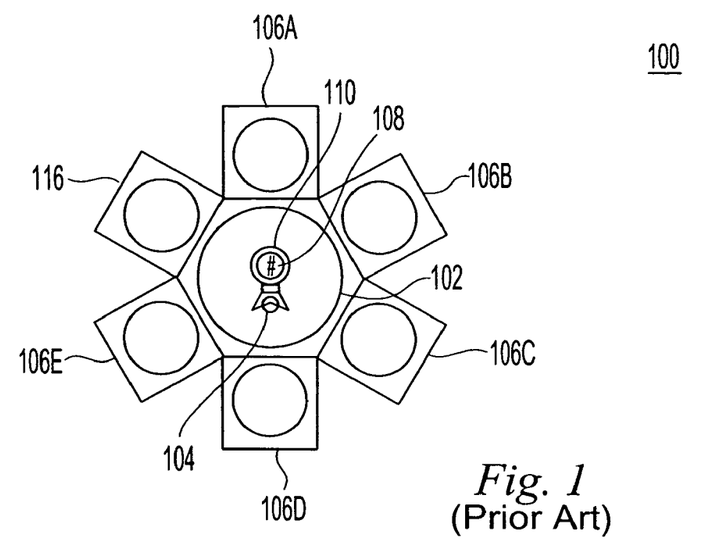
FIG. 1 illustrates a prior art cluster tool having an annular configuration.

Cluster tools are well-known in the prior art. FIG. 1 is a simplified diagram of a cluster tool 100, as disclosed in U.S. Pat. No. 6,321,134, whose contents are incorporated by references. The prior art cluster tool 100 is configured in a circular or round annular configuration. More particularly, as seen in this figure, the cluster tool 100 takes on a hexagonal configuration with six facets. That is, transfer chamber 102, including a robot 104, is placed in a center region, which is surrounded by a plurality of vacuum processing chambers, shown by at least reference numerals 106A, 106B, 106C, 106D, and 106E. It is understood that the transfer chamber 102 is provided with a vacuum pump, or the like, as are the process chambers.

Connected to the transfer chamber 102 is a load lock 116 that may be ported to a clean room where the wafers are stored. As is known to those skilled in the art, robot 104 typically has a hinged arm terminating in a wafer handle 110 for holding a wafer 108. The wafer handle may be disk-shaped, prong-shaped or take on some other shape. Robot 104 can insert and remove a wafer 108 or wafers from any one of the chambers 106A-106E, or into the load lock 116, according to a desired application.

Figure 2:
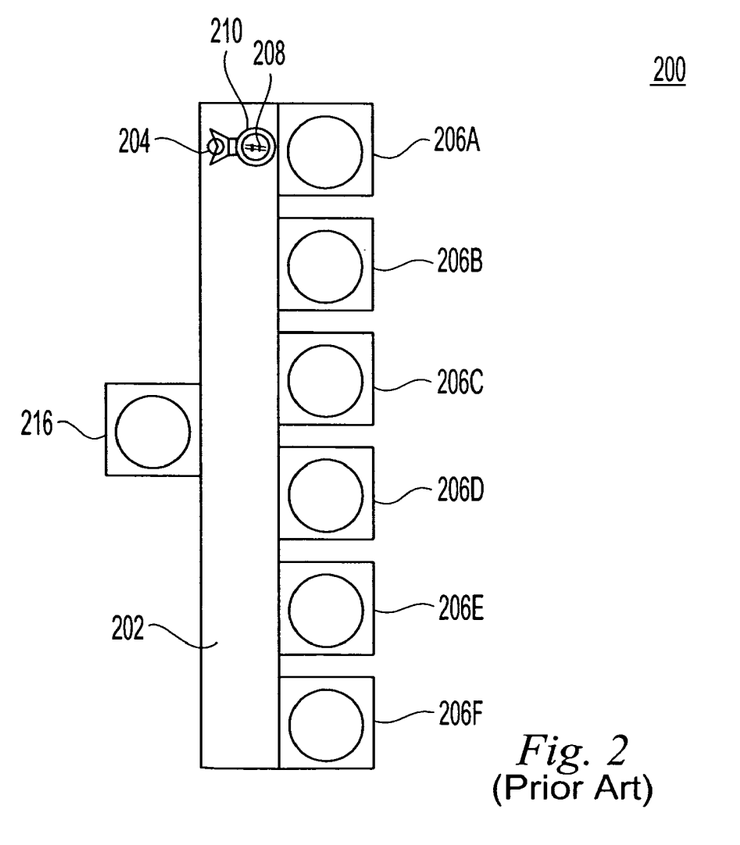
FIG. 2 illustrates a prior art cluster tool having a linear configuration.

FIG. 2 shows another prior art cluster tool 200 which is arranged an in-line or linear configuration. That is, transfer chamber 202, including a robot 204, is placed in parallel alignment with a plurality of vacuum process chambers, shown by reference numerals 206A, 206B, 206C, 206D, 206E and 206F. It is again understood that the transfer chamber 202 is provided with a vacuum pump, or the like, as are the process chambers. A load lock 216 is also provided. Robot 204 can insert and remove a wafer 208 or wafers, which rests on wafer handler 210, from any one of the chambers 206A-206F, or into the load lock 116, according to a desired application.

The individual chambers in either prior art cluster tool 100 or 200 may be provisioned with necessary chucks, tools, valves, connections, and the like, to effect one or more processing steps, all under the direction of one or more controllers, as known to those skilled in the art. It is further understood that a variety of pumps, gas cylinder, ion sources, and the like, may be housed within, and/or connected to the various chambers.

As also known to those skilled in the art, the prior art cluster tools 100, 200 are typically coupled to a controller. Such a controller includes a variety of elements such as a microprocessor based unit, a hard disk memory storage unit, input/output elements such as a pointer device (e.g., mouse), a keyboard and/or touch screen, mouse, and other elements. The controller also may also be associated with a display such as a flat panel display, cathode ray tube ("CRT"), and the like.

The display has a graphical user interface that includes a menu. The menu or menus can correspond to a variety of process recipes that are stored on the hard drive or other memory device. The process recipes can be in the form of a computer program or programs that use computer codes in the form of software. The computer codes carryout the functionality described herein as well as others. A network interface may also be provided.

As disclosed in U.S. Pat. No. 6,763,840, whose contents are also incorporated by reference, supercritical $CO_2$ may be used to clean a substrate in a pressure chamber of a cluster tool. For this, the substrate is first placed in a pressure chamber and the chamber is then pressurized. Next, $CO_2$ is introduced into the pressure chamber, and the substrate is cleaned with the $CO_2$. The $CO_2$ is next removed from the pressure chamber, and the pressure chamber is depressurized. Finally, the substrate itself is removed from the chamber.

SUMMARY OF THE INVENTION

In one aspect, the present invention is directed to a cluster tool. The cluster tool includes a transfer chamber and at least one process chamber connected to the transfer chamber. The at least one process chamber comprises a housing and a high pressure chamber assembly connected to the housing. The high pressure chamber assembly comprises an upper chamber portion, a lower chamber portion movable relative to the upper chamber portion, and a plurality of hydraulic cylinders connecting the two. The upper chamber portion and the housing define a compartment in which the lower chamber portion resides, the high pressure chamber assembly being adjustable between an open position in which the lower chamber portion is spaced apart from the upper chamber portion, and a closed position in which the lower chamber portion contacts the upper chamber portion to thereby form a high pressure chamber enclosing a first space, a second space being defined within the compartment between the lower chamber portion and a bottom wall of the housing. A first valve is provided between the transfer chamber and the housing.

Preferably, the cluster tool is adjustable between (1) a first state in which the first valve is open, the high pressure chamber assembly is open and the transfer chamber and the compartment have a common pressure; (2) a second state in which the first valve is closed, the high pressure chamber assembly is open, the transfer chamber has a first pressure and the second space has a second pressure that is different from the first pressure; and (3) a third state in which the first valve is closed, the high pressure chamber assembly is closed, the transfer chamber has a first pressure, the second space has a second pressure, and the first space has a third pressure, the first and second pressures being below atmospheric pressure and the third pressure being above atmospheric pressure.

In another aspect, the present invention is directed to a high pressure chamber assembly. The high pressure chamber assembly comprises an upper chamber portion, a lower chamber portion movable relative to the upper chamber portion, and a plurality of hydraulic cylinders connecting the upper chamber portion to the lower chamber portion. Tower chamber portion comprises a lower wall, and a lower plate having a front surface and a back surface, the lower plate's back surface abutting the lower wall, the lower plate being provided with at least one through passage for the conveyance of fluids, the back surface of the lower plate being provided with at least one laterally extending channel, for further conveyance of fluids. The high pressure chamber assembly is adjustable between an open position in which the lower chamber portion is spaced apart from the upper chamber portion, and a closed position in which the lower chamber portion contacts the upper chamber portion to thereby form a high pressure chamber enclosing a first space. The entry and exit of fluids into this high pressure chamber is only through the upper chamber portion.

In yet another aspect, the present invention is directed to a method of cleaning a wafer in a process chamber that is connected via a valve to a transfer chamber of a cluster tool, the process chamber including a high pressure chamber adjustable between an open position in which a wafer may be inserted or removed and a closed position in which said wafer can be processed. The method comprises introducing the wafer into the high pressure chamber from the transfer chamber when the valve and the high pressure chamber are both open; closing the valve; closing the high pressure chamber; creating a vacuum in a space between the high pressure chamber and walls of the process chamber; introducing a fluid or gas into the high pressure chamber and processing the wafer; venting the high pressure chamber; opening the high pressure chamber while the valve is closed; pumping the vacuum in said space to equalize pressure between said space and the transfer chamber; opening the gate valve; and removing the wafer via the transfer chamber.

BRIEF DESCRIPTION OF THE DRAWINGS

The present invention is described with respect to one or more preferred embodiments using a number of figures in which.

DETAILED DESCRIPTION OF PREFERRED EMBODIMENT

Figure 3:
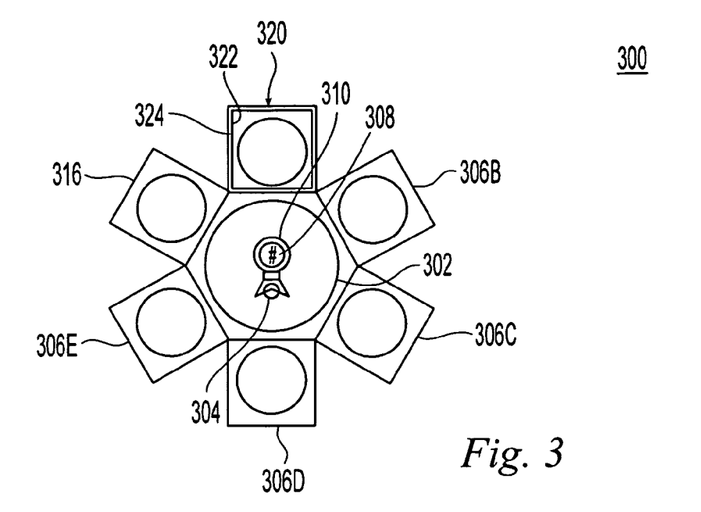
FIG. 3 illustrates a cluster tool in accordance with the present invention having an annular configuration.

FIG. 3 shows a cluster tool 300 in accordance with the present invention having an annular configuration. The cluster tool 300 has a transfer chamber 302, robot 304 with a robot handle 310, conventional vacuum process chambers 306B, 306C, 306D, 306E and a load lock 316, all of which are similar to their counterparts in FIG. 1. The cluster tool 300 additionally has at least one process chamber 320 configured to selectively form a high pressure chamber 322 in cooperation with a vacuum chamber 324, depicted in FIG. 4 as an inner box and a outer box, respectively. The robot 304, robot handle 310, transfer chamber 302 and the various chambers are configured such that a wafer 308 seated on the arm 310 may be selectively transported into and out of any of the chambers. The process chamber 320 preferably has the same footprint as the conventional vacuum process chambers 306B-306E, and so occupies no more floor space than they do.

Figure 4:
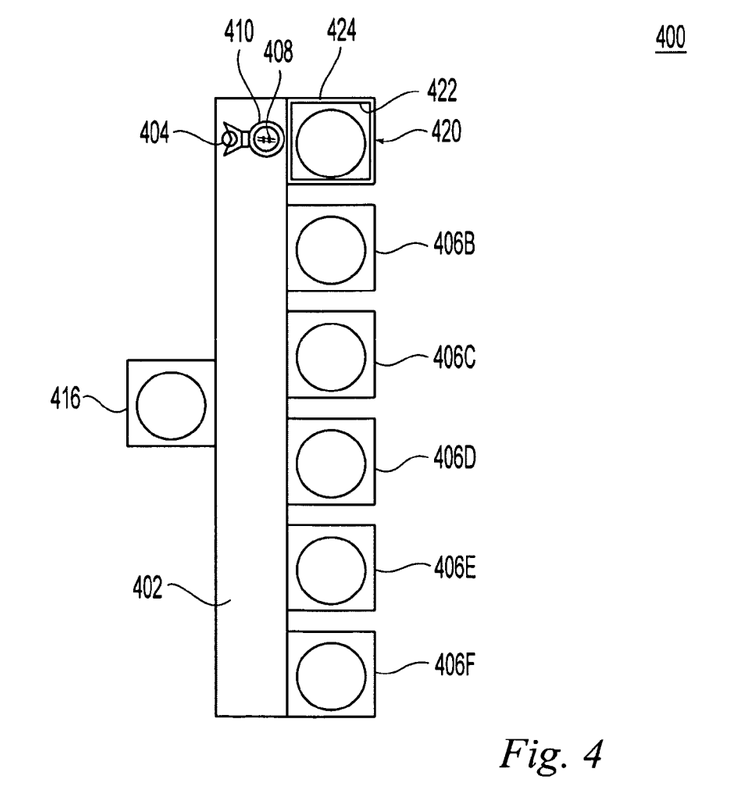
FIG. 4 illustrates a cluster tool in accordance with the present invention having a linear configuration.

FIG. 4 shows a cluster tool 400 in accordance with the present invention having a linear configuration. The cluster tool 400 has a linear transfer chamber 402, robot 404 with a robot arm 410, conventional vacuum process chambers 406B, 406C, 406D, 406E, 406F and a load lock 416, all of which are similar to their counterparts in FIG. 2. The cluster tool 400 additionally has at least one process chamber 420 configured to selectively form a high pressure chamber 422 within a vacuum chamber 424, depicted in FIG. 4 as an inner box and a outer box, respectively. The robot 404, robot arm 410, linear transfer chamber 402 and the various chambers are configured such that a wafer 408 seated on the arm 410 may be selectively transported into and out of any of the chambers. The process chamber 420 preferably has the same footprint as the conventional vacuum process chambers 406B-406F, and so occupies no more floor space than they do.

It is understood that the construction of the process chambers 320 and 420 preferably are identical, and so only process chamber 320 is described in detail.

Figure 5:
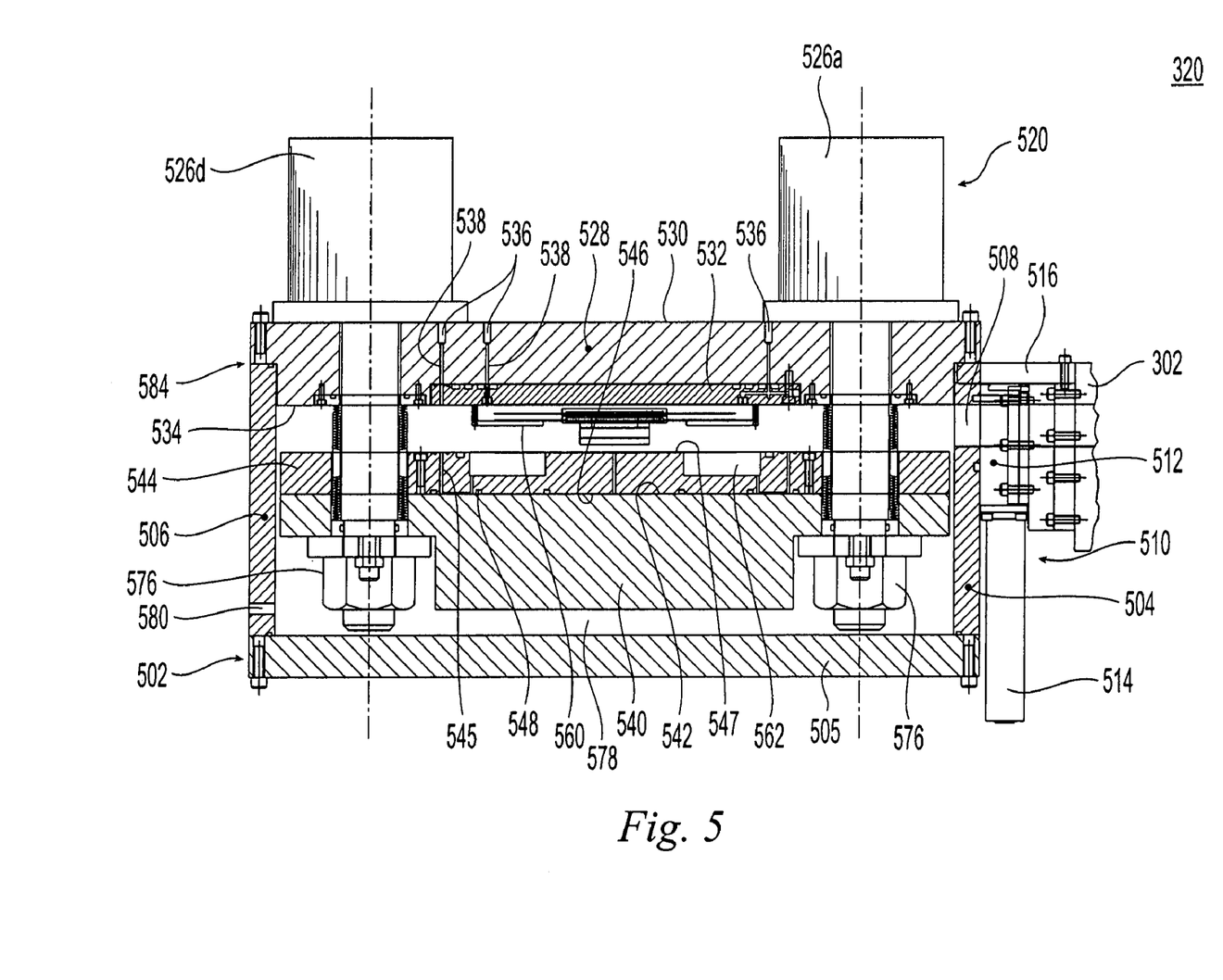
FIG. 5 shows a cross-sectional side view of the process chamber in accordance with one embodiment of the present invention, with the high pressure chamber open.
Figure 6:
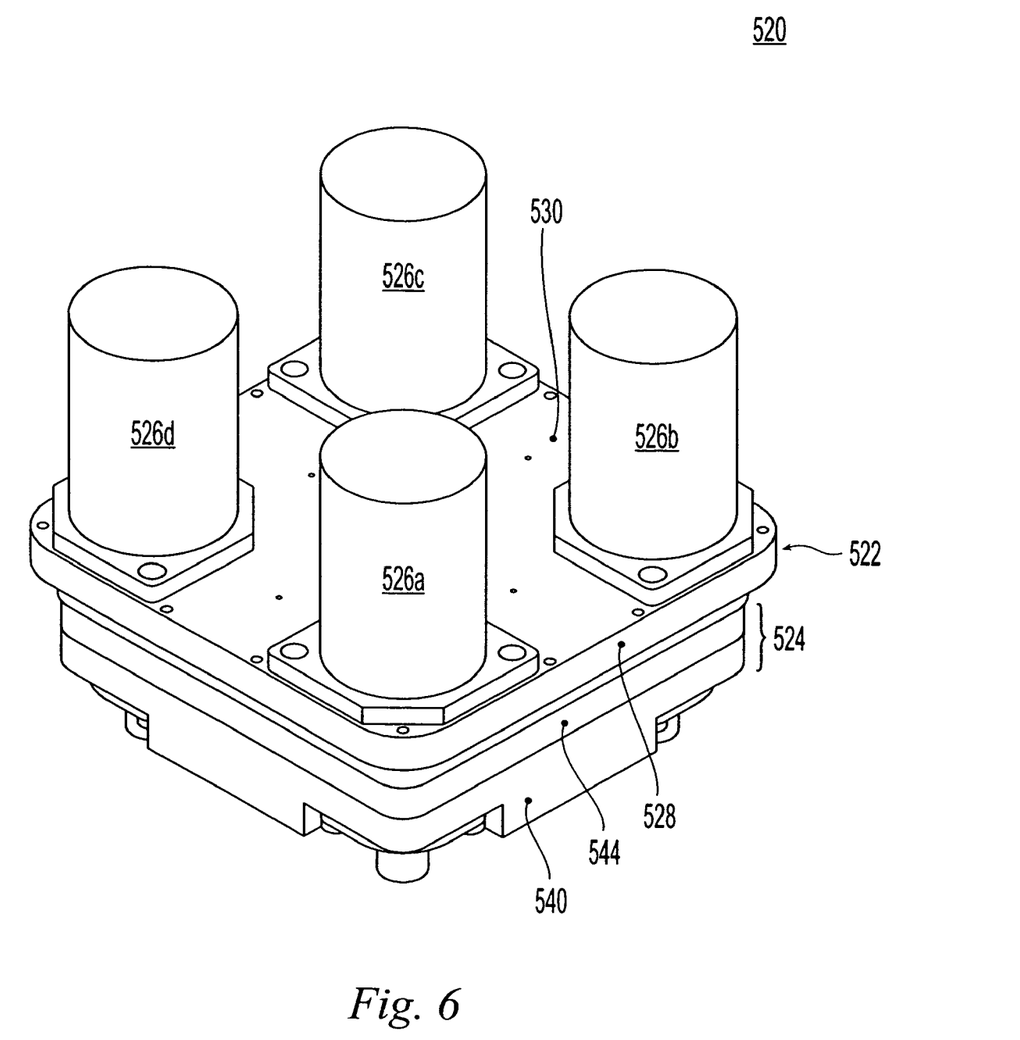
FIG. 6 shows a perspective view of one embodiment of the high pressure chamber in accordance with the present invention.

FIG. 5 shows a cross-section taken parallel to a side of process chamber 320 of FIG. 3. The process chamber 320 comprises a housing 502 and a high-pressure chamber assembly 520 seated thereon. In FIG. 5, the high pressure chamber assembly 520 is in the disassembled (or, alternatively, "open", or "non-operative") position within the process chamber 320. In the discussion below, reference numeral 520 is used to denote both the high pressure chamber and the high pressure chamber assembly, it being understood that the term 'high pressure chamber' refers to the assembly in the "assembled" (or, alternatively, "closed" or "operative") position.

The housing 502 comprises a front wall 504, a bottom wall 505 and three other side walls, shown generally as 506. A substantially rectangular slot 508 is formed in the front wall 504. The slot 508 is of sufficient size to allow the robot handle 310 to enter and place or remove a wafer 308. The slot 508 is operated by a rectangular gate valve 510, sometimes referred to as a 'slot valve' or a 'transfer valve'. As seen in the figures, the gate valve 510 includes an upper actuator portion 512 and a drive portion 514. In a preferred embodiment, a Series 2 MONOVAT® gate valve from VAT Inc. of Woburn, Mass. (www.vatvalve.com) is used.

An adapter 516 connects the process chamber 320 to the cluster tool 300. During use, the purpose of the gate valve 510 is to selectively isolate the transfer chamber 302 from the process chamber 320 so as to effectively prevent the flow of gases and other materials from one to the other.

The high pressure chamber assembly 520 comprises an upper chamber portion 522, a lower chamber portion 524, and a plurality of hydraulic cylinders 526a, 526b, 526c, 526d connecting the two portions.

The upper chamber portion 522 comprises an upper wall 528 having an outwardly facing upper surface 530 and an inwardly facing lower surface 534. A ring-like upper chamber plate 532 is mounted in a recess 533 formed on the inwardly facing lower surface 534. A plurality of inlets and outlets, shown generally as 536, connect to upper through passages 538 formed through both the upper wall 528 and the upper chamber plate 532. The inlets, outlet and upper through passages permit the introduction, exit and conveyance of fluids such as gases and liquids into and out of portions the high pressure chamber 520. The external plumbing, tubing, connections, gas and liquid cylinders and the like have been omitted from the figures, as these are known to those skilled in the art, exemplified by the aforementioned prior art patents.

The lower chamber portion 524 comprises a lower wall 540 having a flat inwardly facing surface 542. The lower chamber portion further comprises a lower plate 544 having a back surface 546 and an operative front surface 547. The lower plate 544 is mounted onto the lower wall 540 with the back surface 546 of the lower plate 544 abutting the flat inwardly facing surface 542 of the lower wall 540.

The lower plate 544 may be provided with a plurality of lower through passages 545 for the conveyance of fluids that were introduced via the upper through passages 538 formed in the upper chamber portion 522. Preferably, some of the lower through passages are aligned with the upper through passages 538. Furthermore, the back surface 546 of the lower plate 544 may be provided with a plurality of laterally extending channels 548 for collection and further conveyance of fluids back towards upper through passages from which they may exit the high pressure chamber via the upper surface 530 of the upper chamber portion.

Thus, for the high pressure chamber 520, all mechanical and fluid penetrations for gases, liquids and other materials and items, are made only in one of the two portions. Specifically, they are made in the upper wall 528 of the upper chamber portion 522. The lower chamber portion 524, and especially its lower wall 540, are devoid of through passages configured to carry gases, liquids, and the like, to the interior of the high pressure chamber 520. It should therefore be evident, then, that all external connections for the high pressure chamber 520 only come into the upper chamber portion. This permits the lower chamber portion 524 to be completely isolated from the external surfaces of the process chamber 320.

The ring-like upper plate 532 and the lower plate 544 may be provided with a variety of structures and formations such as wafer support fingers 560, pockets 562, and the like for supporting and receiving wafers or other workpieces, all as known to those skilled in the art. When the high pressure chamber is in the closed position, the fingers 560 are received in the pockets 562. (See FIGS. 5 and 9).

Figure 7:
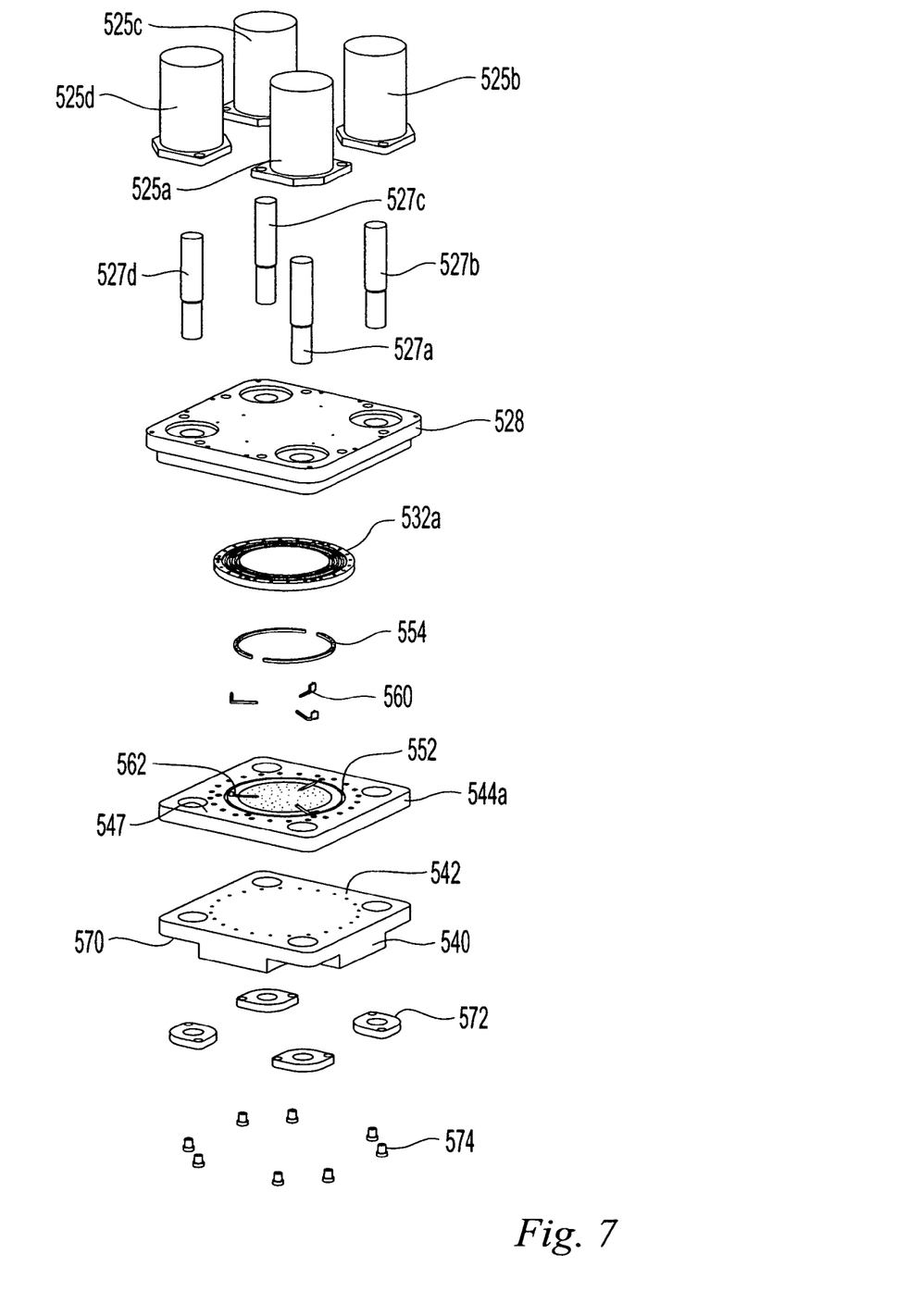
FIG. 7 shows an exploded top perspective view of the major components of one embodiment of the high pressure chamber.
Figure 8:
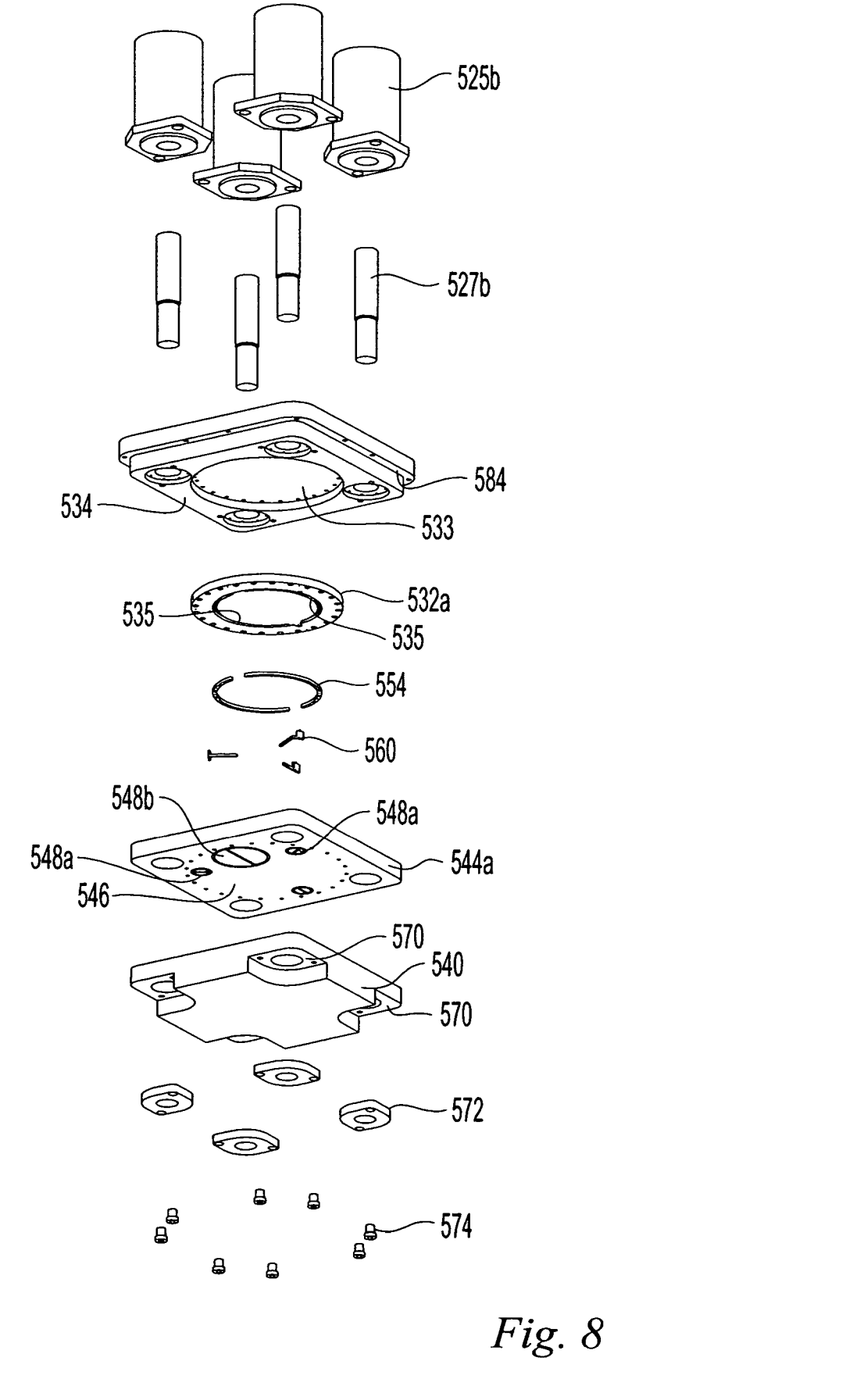
FIG. 8 shows an exploded bottom perspective view of the components seen in FIG. 7.

With reference to FIGS. 7 and 8, the ring-like upper plate 532a and the lower plate 544a, show additional features. The radially inner edge of the upper plate 532a is provided with a pair of arcuate tracks 535 configured and dimensioned to receive correspondingly configured and dimensioned arcuate distribution elements 554, which form a "showerhead" for promoting uniform distribution of a liquid over a wafer.

The operative front surface 547 of lower plate 544a preferably is provided with a circular groove 552 configured and dimensioned to receive a O-ring seal (not shown) that provides the high pressure seal when the high pressure chamber is pressurized. The upper operative front surface 547 may also be provided with a plurality of narrow pockets 562 configured and dimensioned to receive wafer support fingers 560 when the high pressure chamber is closed, the fingers 560 themselves being affixed to, and suspended from, the inwardly facing lower surface 534.

Furthermore, as best seen in FIG. 8, the back surface 546 of the lower plate 544a is provided with a plurality of laterally extending channels 548a associated with pockets 562 formed on the upper operative front surface 547. Preferably, at least one laterally extending channel 548b, not associated with a pocket 562, is also provided on the back surface 546.

As best seen in the exploded views of FIGS. 7 and 8, the hydraulic cylinders 526a, 526b, 526c, 526d each comprise a cylinder head 525a, 525b, 525c, 525d, respectively, and a cylinder rod 527a, 527b, 527c, 527d, respectively. The top portions of the cylinder rods are retained in the cylinder head while rods themselves pass through openings in the upper chamber portion 522 and the lower chamber portion, and emerge in recesses 570 formed on the underside of the lower wall 540. Within these recesses 570, the rods pass through flange-like pressure fittings 572 secured in the recesses by bolts 574, and are themselves secured by nuts 576. Thus, each hydraulic cylinder 526a, 526b, 526c, 526d has a portion that extends between the upper chamber portion 522 and the lower chamber portion 524 and connects the upper chamber portion 522 to the lower chamber portion 524.

The high pressure chamber 520 is connected to the process chamber housing 502 via a peripheral lip 584 formed on the underside of the upper surface 530. As seen in the figures, the lip 584 of the upper chamber wall 528 abuts the top edge of the front wall 504 and side walls 516 of the housing 502. The lip 584 is secured to the top edges by bolts (not shown). This forms a seal between the upper chamber wall 528 and the process chamber housing 502. Furthermore, in this arrangement, the walls 504, 516 of the housing 502 support the weight of the high pressure chamber 520.

In the arrangement depicted in FIG. 5, the high pressure chamber assembly 520 is disassembled in the sense that the upper chamber portion 522 and the lower chamber portion 524 are separated from one another. In such case, the pressure throughout the process chamber 320 is uniform. And if the gate valve 510 is open, then the pressure in both the transfer chamber 302 and the process chamber 320 is the same.

Figure 9:
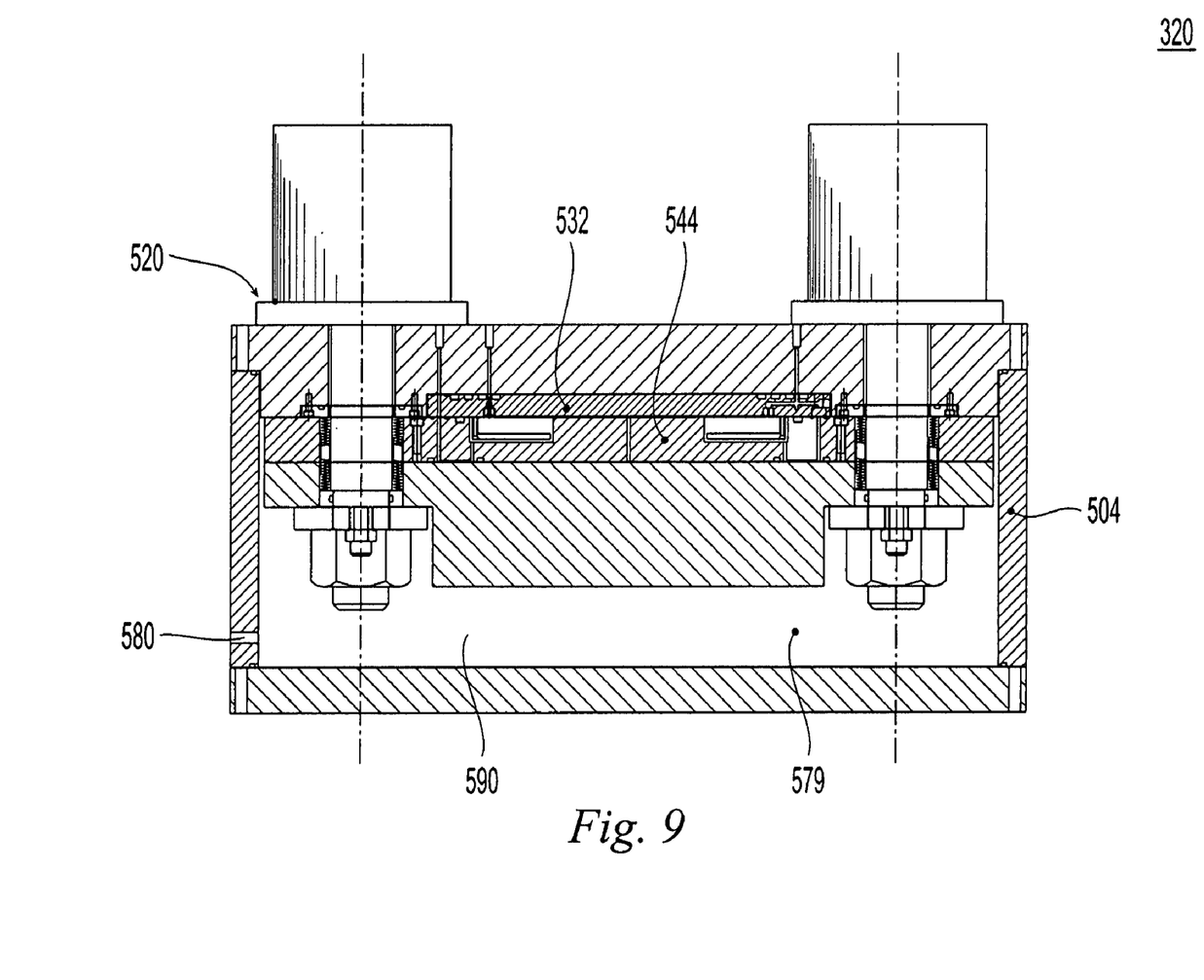
FIG. 9 shows a cross-sectional side view of the process chamber of FIG. 5, with the high pressure chamber closed

FIG. 9 shows the process chamber 320 of FIG. 5 with the high pressure chamber assembly 520 in the assembled (or, alternatively, "closed", or "operative") position. In FIG. 9, the front wall 504 is depicted as a solid wall (i.e., minus the slot 508), and the gate valve 510, the adapter 516 and the transfer chamber 302 have been removed to focus on the high-pressure chamber 520 (which may also be referred to as the "first", or "primary" chamber) and a vacuum chamber 590 (which may also be referred to as the "second" or "auxiliary" chamber) formed within the process chamber 320.

As seen in FIG. 5, when the high pressure chamber is open, there is a space 578 of a first size between the lower wall 540 of the lower chamber portion 524 and the bottom wall 505 of the housing. As seen in FIG. 9, when the high pressure chamber is closed, there is a space 579 of a second, larger size between the lower wall 540 of the lower chamber portion 524 and the bottom wall 505. This enlarged space 579 is the result of the upward movement of the lower chamber portion 524 away from the bottom wall 505; it is this enlarged space 579 that forms part of the vacuum chamber 590.

From the above description, it should be evident that the housing's front wall, bottom wall and side walls, and the upper chamber portion 522, together define a compartment. This compartment is accessible via the slot 508, which is selectively sealed by gate valve 510. The lower chamber portion 524 resides in this compartment as do the spaces 578 and 579 when the high pressure assembly is open and closed, respectively.

To adjust the high pressure chamber from the disassembled position to the assembled position, a hydraulic power unit (not shown) is used to activate the hydraulic cylinders. This causes the lower chamber portion 524 to move in an upward direction, away from the housing bottom wall 505 and towards the upper chamber portion. A pressure of between 800 psi and 1,200 psi is applied for this purpose, which results in the lower chamber portion 524 contacting the upper chamber portion 522 to thereby form the high pressure chamber 520 enclosing a first space in which processing may take place. During wafer processing operations, the hydraulic power unit can be further activated to apply a pressure of anywhere from 4,000 psi to 10,000 psi, as needed.

With the gate valve 510 closed, and the high pressure chamber 320 assembled, a vacuum may be applied via opening 580 formed in the housing side wall to create a vacuum chamber 590 in a space between the lower chamber portion 524 and the housing bottom wall 505. In such case, the processing chamber 320 has both a high pressure chamber 520 and a vacuum chamber 590 coexisting within the process chamber and sharing the lower chamber portion as a boundary. Specifically, the high pressure chamber 520 is formed between the upper chamber portion 522 in abutment with the lower chamber portion 524, and the vacuum chamber is formed in the space 579 between the lower chamber portion 522 and a bottom wall 505 of the housing. Thus, during operation, the transfer chamber 302 and the space 579 within the vacuum chamber 590 are typically below atmospheric pressure, while a first space defined within the high pressure chamber 520 where the wafer is being processed is well above atmospheric pressure.

Figure 10:
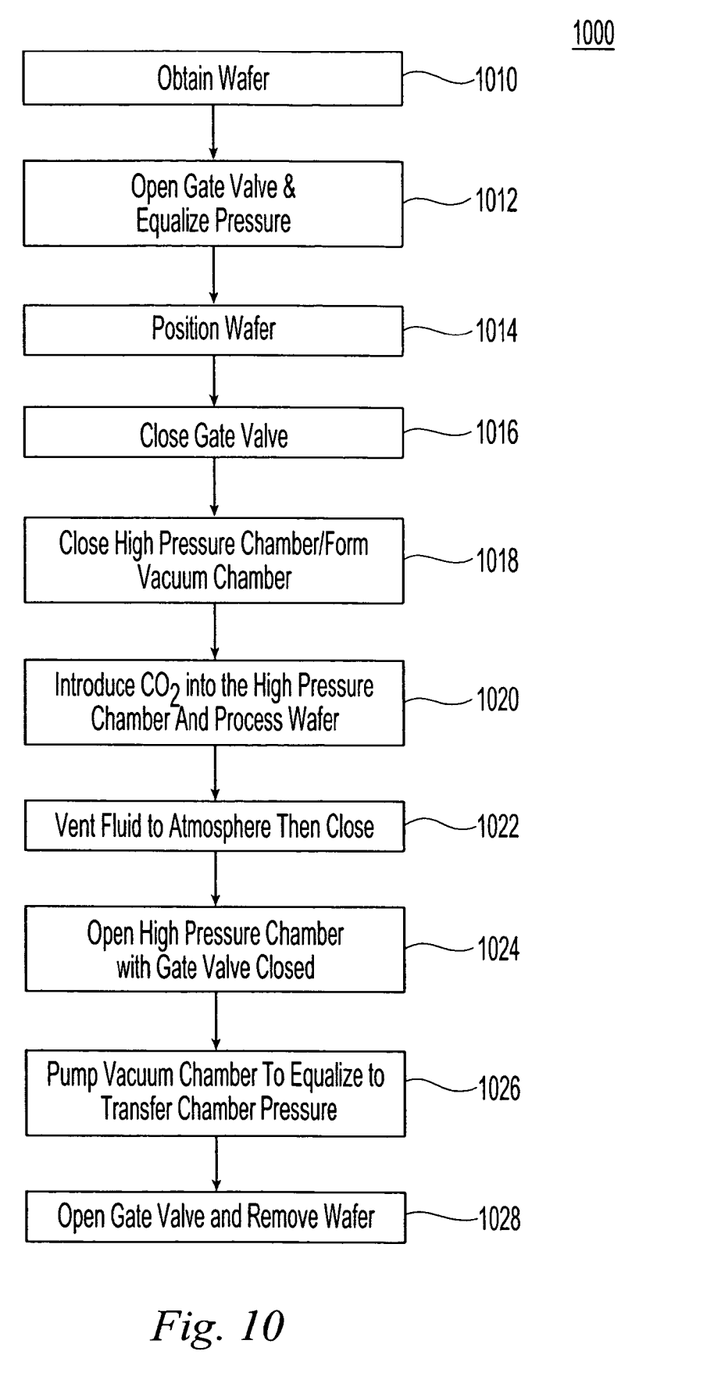
FIG. 10 shows an exemplary flow diagram for using the process chamber.

A preferred method for using the process chamber 320 with the annular cluster tool 300 is now described with reference to a supercritical $CO_2$ application, and the flow diagram 1000 of FIG. 10.

In step 1010, the robot 304 obtains a wafer 308 which is placed on the robot's handle 310. In a preferred embodiment, the robot 304 would have picked up the wafer from one of the other vacuum process chambers 306B-306E. The transfer chamber 302 during this time is under vacuum, at about 80-100 mTorr.

In step 1012, the gate valve 510 between the transfer chamber 302 and the process chamber 320 is then opened. At this point, the high pressure chamber 520 is open; that is, the lower chamber portion 524 is lowered relative to the upper chamber portion 522. When the gate valve 510 is opened, the entire processing chamber 320 will be under a common vacuum, as will the transfer chamber 302.

In step 1014, the robot 304 will extend its handle 310 and place the wafer 308 on fingers or other structures inside the open high pressure chamber. The robot will then retract into the transfer chamber 302.

In step 1016, the gate valve 510 then closes. This isolates the vacuum pressure in the transfer chamber 302 from that in the process chamber.

In step 1018, the high pressure chamber closes. This results in three isolated regions—the transfer chamber 302, the closed high pressure chamber 520 in which the wafer is placed, and the vacuum chamber 590 formed between the process chamber housing 502 and the closed high pressure chamber 520.

At this point, all three isolated regions are at vacuum. A first vacuum pump is used to create a first vacuum level in the transfer chamber 302 while a second vacuum pump is used to create a second vacuum level in the vacuum chamber 590. Preferably, the second vacuum level is to a greater degree (i.e., to a lower vacuum pressure) than the first vacuum level.

Next, in step 1020, high pressure fluid is introduced into the high pressure chamber 520. In a preferred embodiment, the high pressure fluid is $CO_2$, and the pressure is between 4,000 psi and 10,000 psi. Any leakage will enter the vacuum chamber 590 around the high pressure chamber 520 and will be pumped before it can affect the transfer chamber 302 and the other process chambers 306B-306E.

The wafer 508 is then processed by the high pressure fluid, such as by exposure to the high pressure fluid for a predetermined length of time.

In step 1022, after processing is complete, the fluid in the high pressure chamber 520 is vented to atmosphere. The vent to the high pressure chamber 520 is then closed. At this juncture, there will be a residual amount of fluid at atmospheric pressure in the high pressure chamber 520.

Then, in step 1024, the high pressure chamber 520 is opened. Because the vacuum chamber 590 is at a vacuum, the residual amount of fluid will flash. At this point, the gate valve 510 is still closed, so the residual fluid is still isolated from the transfer chamber.

In step 1026, the vacuum chamber 590 (which now also includes the region between the upper chamber portion and the lower chamber portion) is then pumped until the residual fluid is removed and the pressure is equal on both sides of the gate valve 510. Failing to equalize the pressure in the vacuum chamber 590 and the transfer chamber 302 may result in particles migrating from one to the other due to the pressure differential.

Finally, in step 1028, the gate valve 510 is then opened and the wafer 508 is removed by the robot 504.

Although the present invention has been described to a certain degree of particularity, it should be understood that various alterations and modifications could be made without departing from the scope of the invention as hereinafter claimed.

What is claimed is:

1. A cluster tool comprising:
a transfer chamber;
at least one process chamber connected to the transfer chamber, the at least one process chamber being adjustable between a first position in which a high pressure chamber is disassembled within the process chamber and a second position in which the high pressure chamber is assembled within the process chamber, the at least one process chamber comprising:
a housing; and
a high pressure chamber assembly connected to the housing, the high pressure chamber assembly comprising an upper chamber portion, a lower chamber portion movable relative to the upper chamber portion, and a plurality of hydraulic cylinders, each hydraulic cylinder having a portion that extends between the upper chamber portion and the lower chamber portion and connects the upper chamber portion to the lower chamber portion, the upper chamber portion and the housing defining a compartment in which the lower chamber portion resides, the high pressure chamber assembly being adjustable between an open position in which the lower chamber portion is spaced apart from the upper chamber portion, and a closed position in which the lower chamber portion contacts the upper chamber portion to thereby form a high pressure chamber enclosing a first space, a second space being defined within the compartment between the lower chamber portion and a bottom wall of the housing; wherein the second space forms part of a vacuum chamber within the process chamber; and
a first valve between the transfer chamber and the housing.

2. The cluster tool according to claim 1, wherein the tool is adjustable between:
a first state in which the first valve is open, the high pressure chamber assembly is open and the transfer chamber and the compartment have a common pressure;

a second state in which the first valve is closed, the high pressure chamber assembly is open, the transfer chamber has a first pressure and the second space has a second pressure that is different from the first pressure; and a third state in which the first valve is closed, the high pressure chamber assembly is closed, the transfer chamber has a first pressure, the second space has a second pressure, and the first space has a third pressure, the first and second pressures being below atmospheric pressure and the third pressure being above atmospheric pressure.

3. The cluster tool according to claim 1, wherein the transfer chamber, the process chamber and the high pressure chamber are configured such that a wafer in the transfer chamber is transferable to the high pressure chamber under vacuum.

4. The cluster tool according to claim 1, wherein:
the housing has a rectangular footprint and comprises:
a bottom wall connected to three side walls and also to a front wall; and
a slot formed in the front wall, the slot being of sufficient shape and size to permit passage therethrough of a robot handle carrying a wafer; and
the high pressure chamber assembly is supported by walls of the housing.

5. The cluster tool according to claim 4, wherein the upper chamber portion comprises an upper chamber wall having a lip which rests on walls of the housing.

6. The cluster tool according to claim 1, wherein the entry and exit of fluids into the high pressure chamber is only through the upper chamber portion.

7. The cluster tool according to claim 1, wherein:
the upper chamber portion comprises an upper wall through which a plurality through passages are provided for the entry or exit of fluids; and
the lower chamber portion comprises a lower wall that is devoid of such through passages.

8. The cluster tool according to claim 1, wherein the lower chamber portion comprises:
a lower wall; and
a lower plate having a front surface and a back surface, the lower plate's back surface abutting the lower wall, the lower plate being provided with at least one through passage for the conveyance of fluids, the back surface of the lower plate being provided with at least one laterally extending channel, for further conveyance of fluids.

9. The cluster tool according to claim 8, wherein the lower wall is devoid of such through passages.

10. A process chamber adjustable between a first position in which a high pressure chamber is disassembled within the process chamber and a second position in which the high pressure chamber is assembled within the process chamber, the process chamber comprising:
a housing; and
a high pressure chamber assembly comprising:
an upper chamber portion mounted to the housing;
a lower chamber portion movable relative to the upper chamber portion, the lower chamber portion comprising:
a lower wall; and
a lower plate having a front surface and a back surface, the lower plate's back surface abutting the lower wall, the lower plate being provided with at least one through passage for the conveyance of fluids, the back surface of the lower plate being provided with at least one laterally extending channel, for further conveyance of fluids; and a plurality of hydraulic cylinders, each hydraulic cylinder having a portion that extends between the upper chamber portion and the lower chamber portion and connects the upper chamber portion to the lower chamber portion, the high pressure chamber assembly being adjustable between an open position in which the lower chamber portion is spaced apart from the upper chamber portion, and a closed position in which the lower chamber portion contacts the upper chamber portion to thereby form a high pressure chamber enclosing a first space, a second space being defined between the lower chamber portion and a bottom wall of the housing;

wherein the entry and exit of fluids into the high pressure chamber is only through the upper chamber portion;

wherein the second space forms part of a vacuum chamber within the process chamber.

11. A cluster tool comprising:
a transfer chamber; and
at least one process chamber connected to the transfer chamber, the at least one process chamber being adjustable between a first position in which a high pressure chamber is disassembled within the process chamber and a second position in which the high pressure chamber is assembled within the process chamber, the at least one process chamber comprising:
a housing; and
a high pressure chamber assembly connected to the housing, the high pressure chamber assembly comprising an upper chamber portion and a lower chamber portion movable relative to the upper chamber portion, the high pressure chamber assembly being adjustable between an open position in which the lower chamber portion is spaced apart from the upper chamber portion, and a closed position in which the lower chamber portion contacts the upper chamber portion to thereby form a high pressure chamber enclosing a first space, a second space between the lower chamber portion and a bottom wall of the housing forming part of a vacuum chamber within the process chamber.

12. The cluster tool according to claim 11, wherein the tool is adjustable between:
a first state in which a first valve positioned between the transfer chamber and the housing is open, the high pressure chamber assembly is open and the transfer chamber and the compartment have a common pressure;
a second state in which the first valve is closed, the high pressure chamber assembly is open, the transfer chamber has a first pressure and the second space has a second pressure that is different from the first pressure; and
a third state in which the first valve is closed, the high pressure chamber assembly is closed, the transfer chamber has a first pressure, the second space has a second pressure, and the first space has a third pressure, the first and second pressures being below atmospheric pressure and the third pressure being above atmospheric pressure.

13. The cluster tool according to claim 11 wherein the transfer chamber, the process chamber and the high pressure chamber are configured such that a wafer in the transfer chamber is transferable to the high pressure chamber under vacuum.

14. The cluster tool according to claim 11, wherein:
the housing has a rectangular footprint and comprises:
a bottom wall connected to three side walls and also to a front wall; and a slot formed in the front wall, the slot being of sufficient shape and size to permit passage therethrough of a robot handle carrying a wafer; and the high pressure chamber assembly is supported by walls of the housing.

15. The cluster tool according to claim 14, wherein the upper chamber portion comprises an upper chamber wall having a lip which rests on walls of the housing.

16. The cluster tool according to claim 11, wherein the entry and exit of fluids into the high pressure chamber is only through the upper chamber portion.

17. The cluster tool according to claim 11, wherein:

the upper chamber portion comprises an upper wall through which a plurality through passages are provided for the entry or exit of fluids; and the lower chamber portion comprises a lower wall that is devoid of such through passages.

18. The cluster tool according to claim 11, wherein the lower chamber portion comprises:

a lower wall; and a lower plate having a front surface and a back surface, the lower plate's back surface abutting the lower wall, the lower plate being provided with at least one through passage for the conveyance of fluids, the back surface of the lower plate being provided with at least one laterally extending channel, for further conveyance of fluids.

19. The cluster tool according to claim 18, wherein the lower wall is devoid of such through passages.

* * * * *